US005168422A

United States Patent [19]

Duncan

[11] Patent Number: 5,168,422

[45] Date of Patent: Dec. 1, 1992

[54] SELF-ENCLOSED NEON TRANSFORMER

[75] Inventor: Richard C. Duncan, Scarborough, Canada

[73] Assignee: Allanson, Division of Jannock Limited, Toronto, Canada

[21] Appl. No.: 698,248

[22] Filed: May 6, 1991

Related U.S. Application Data

[63] Continuation of Ser. No. 404,944, Sep. 8, 1989, abandoned.

[51] Int. Cl.[5] ........................ H05K 5/00; H01F 27/04

[52] U.S. Cl. .................................... 361/377; 174/52.2; 174/DIG. 2; 336/96; 336/107; 361/357

[58] Field of Search ........................ 361/356, 357, 377; 174/52.2, DIG. 2; 336/155, 160, 192, 105, 107, 96

[56] References Cited

U.S. PATENT DOCUMENTS

| | | | |
|---|---|---|---|
| 1,965,437 | 7/1934 | Staehle | 336/107 X |
| 2,055,624 | 9/1936 | Dickson | 336/107 X |
| 2,298,336 | 10/1942 | Babb | 336/107 X |
| 2,359,186 | 9/1944 | Zelt | 336/107 X |
| 2,525,467 | 10/1950 | Zelt | 174/DIG. 2 X |
| 2,702,378 | 2/1955 | Talty | 174/DIG. 1 X |
| 2,740,905 | 4/1956 | Henderson | 174/DIG. 2 X |
| 2,779,496 | 1/1957 | Henderson | 174/DIG. 2 X |
| 2,779,812 | 1/1957 | Rowe | 174/DIG. 2 X |
| 3,030,597 | 4/1962 | Piaia, Jr. et al. | 336/107 X |

FOREIGN PATENT DOCUMENTS

| | | | |
|---|---|---|---|
| 622655 | 6/1961 | Italy | 336/107 |

OTHER PUBLICATIONS

Catalog: Plastic Sign Ballasts and Luminous Tube Sign Transformers.

Catalog: Ballasts and Transformers for Dependable and Long-Lasting Outdoor Lighting.

Book: Neon Techniques and Handling.

*Primary Examiner*—Thomas J. Kozma

*Attorney, Agent, or Firm*—Baker & Daniels

[57] ABSTRACT

A neon or luminous tube transformer is provided having a primary coil located between a pair of secondary coils. Each of the coils comprises a plurality of windings and is associated with a laminated magnetic core. A secondary terminal extends vertically from each secondary coil and is provided with a threaded upper end. The primary and secondary coils are disposed in a housing defining an enclosed first compartment and the compartment is filled with asphalt to a level so that only the upwardly projecting secondary terminals are exposed. A pair of primary input conductors are connected to the transformer primary coil and pass through one of the walls defining the first compartment into a smaller second compartment adjacent the first compartment. One wall of the second compartment is provided with a knockout to permit the conductors extending from a low voltage power supply to be connected to the primary input conductors within the housing thereby allowing the primary coil to be energized. At least one wall of the first compartment is provided with a knockout to permit conductors extending from the transformer load to be connected to the secondary terminals within the first compartment. A plastic threaded cap is associated with each threaded secondary terminal to permit the conductors extending to the transformer load to be removably secured to the secondary terminal and to inhibit accidental disengagement thereof.

9 Claims, 1 Drawing Sheet

SELF-ENCLOSED NEON TRANSFORMER

This is a continuation of application Ser. No. 07/404,944, filed Sep. 8, 1989, now abandoned.

The present invention relates to a transformer and in particular to a neon or luminous tube transformer.

Neon or luminous tube transformers are well known in the art. Typically, these types of transformers are used to step up the voltage supplied to the primary winding thereof. The primary winding generally consists of a few hundred turns of moderately heavy diameter wire. Conventionally, the primary winding is disposed between a pair of secondary windings, with each of the windings being separated by laminated magnetic material. The secondary windings include many thousands of turns of smaller diameter wire so that the voltage applied across the transformer primary winding can be stepped up. The three transformer windings are completely enclosed in the interior of a housing and the housing is filled with a tar-like compound. A pair of input wires extend from the primary winding and terminate in a connector projecting outwardly from one of the outer walls of the housing. The connector facilitates the connection of the input wires to the voltage power source.

A high voltage output terminal extends from each of the secondary coils and each output terminal projects outwardly through a porcelain insulator or bushing from opposite end walls of the housing. This permits the conductors extending from a transformer load to be connected to the output terminals, while electrically isolating the transformer housing from the high output terminals. However, a problem exists in these types of transformers in that the porcelain insulators are expensive accounting for a significant portion of the manufacturing cost of the transformer. Moreover, the porcelain insulators project outwardly from the housing thereby increasing the overall size of the transformer. Furthermore, due to safety regulations, the transformer must be completely enclosed to isolate the live terminals of the transformer from the environment. This effectively requires the transformer windings to be enclosed by two housings which reduces heat dissipation in the transformer. This of course causes the temperature in the transformer to increase during operation thereby reducing the life expectancy of the transformer insulation and hence the transformer itself.

To make the shape of these types of transformers more uniform and to attempt also to improve heat dissipation in the transformers, neon transformers having extended housing walls have been made. An example of such a transformer is the 711 series transformer manufactured by Jefferson Electric Company. These transformers include a housing defining two small compartments disposed on either side of an inner compartment which houses the transformer primary and secondary coils. The smaller compartments house the porcelain insulators and the secondary output terminals extending from the side walls of the inner compartment. Knockouts are provided in the housing adjacent the smaller compartments to permit the conductors extending from the transformer load to be connected to the secondary terminals within the smaller compartments.

Although these types of transformers provide a uniform rectangular shape for the transformer, problems still exist in that these transformers use porcelain insulators to isolate electrically the high voltage secondary terminals from the transformer housing. Moreover, the size of the transformer is increased due to the extension of the housing on either side of the inner compartment to house the porcelain insulators and to provide sufficient room to connect a connector to the secondary terminals.

It is therefore an object of the present invention to obviate or mitigate the above disadvantages by providing a novel neon transformer.

According to the present invention, there is provided a neon or luminous tube transformer comprising:

a housing defining an enclosed first compartment;

a primary coil positioned between a pair of secondary coils, each of said coils being spaced apart and including a winding having a plurality of turns;

a first magnetizable core passing through each of said coils;

second magnetizable cores located between said secondary coils and said primary coil to define magnetic shunts, said coils and said magnetizable cores being located within said first compartment;

a pair of insulated primary input conductors connected to said primary coil and extending through a wall of said housing to connection to an input power supply exterior to said first compartment;

a pair of secondary terminal extending from said secondary coils and being located within said first compartment; and releasable fastening means associated with each of said secondary terminals for releasably securing an insulated output conductor extending to a transformer load thereto within said first compartment, said housing including means for allowing said output conductors to pass into said first compartment to permit engagement of said output conductors to said secondary terminals within said first compartment.

Preferably, the secondary terminals extend vertically from the secondary coils and are in the form of threaded rods with each of the rods having a fastener threadably engaged therewith for securing the output conductor to the secondary terminal. It is also preferred that the fasteners are in the form of plastic caps.

Preferably, the transformer further includes a second compartment substantially smaller than the first compartment. The second compartment receives the primary input conductors and the conductors extending from the power supply and provides sufficient space for the conductors and the primary input conductors to be connected. It is also preferred that the second compartment includes a switch operable to isolate the primary input conductors without requiring the conductors extending from the power supply to be disconnected manually from the primary input conductors.

The present transformer provides advantages in that the requirement for porcelain insulators on the secondary terminals is removed since the terminals and electrical connections to the secondary terminals are disposed within the housing and spaced from the housing walls while still maintaining a compact housing for the transformer. This of course reduces costs when manufacturing the transformer. Moreover, since all terminals of the transformers are located within the transformer housing, the transformer does not need to be covered during operation thereby increasing heat dissipation in the transformer and increasing the life expectancy thereof.

An embodiment of the present invention will now be described by way of example only with reference to the accompanying drawings in which.

Figure 1:
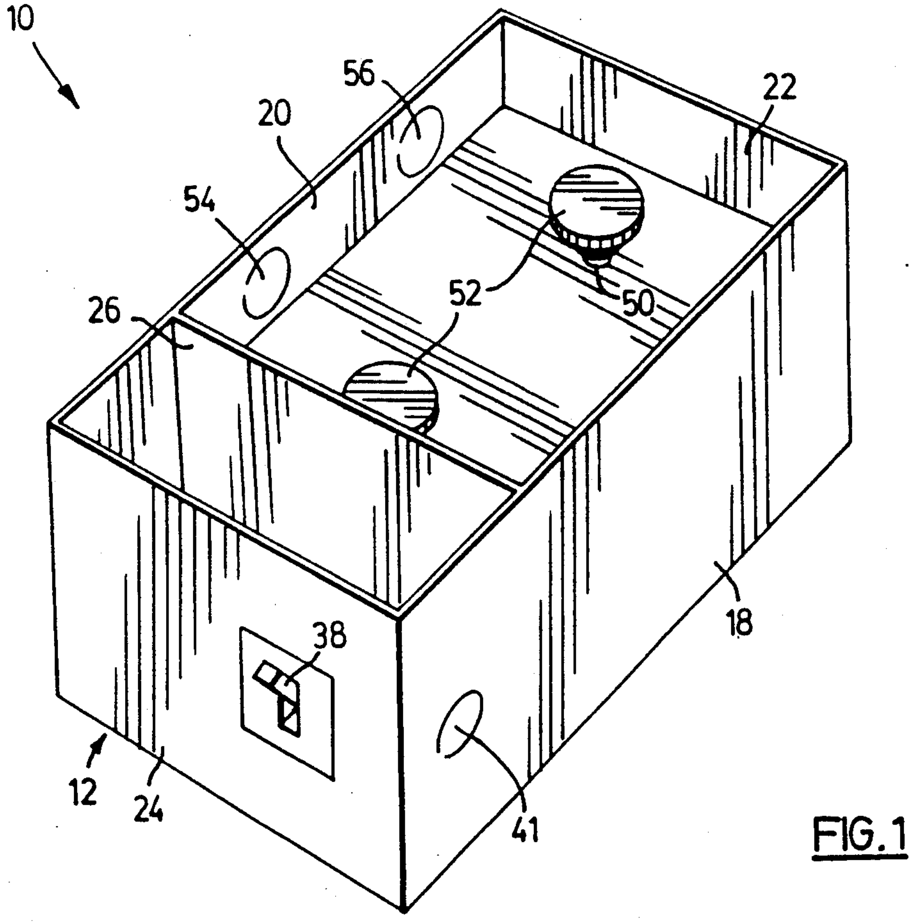
FIG. 1 is a cut-a-way perspective view of a neon transformer.
Figure 2:
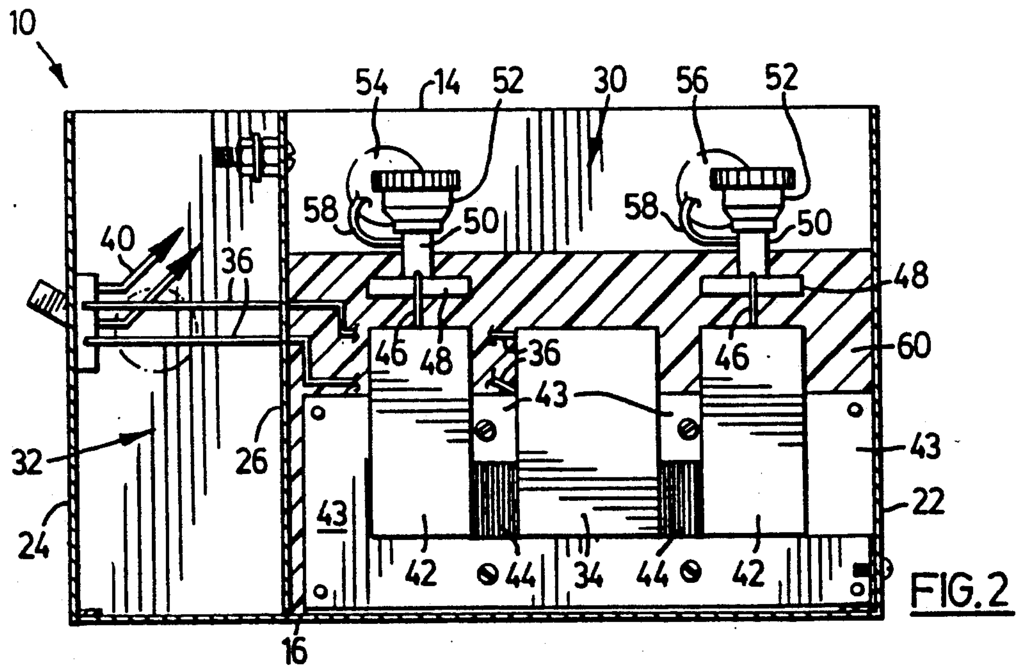
FIG. 2 is a sectional view of the neon transformer taken along line 2—2.

Referring to the figures, a neon or tube transformer is shown and generally indicated by reference numeral 10. The transformer includes a housing 12 having top and bottom walls 14,16, side walls 18,20 and end walls 22,24 respectively. An inner wall 26 extends across the width of the housing 12 to divide the interior of the housing into two separate, isolated compartments 30,32 respectively.

The compartment 30 is substantially larger than the compartment 32 and houses the transformer components therein. The transformer 10 includes a primary coil 34 comprising approximately 300 turns of heavy diameter wire. A pair of conductors 36 extend from the windings of the primary coil 34 and pass through the inner wall 26 into the second compartment 32. The ends of the conductors 36 are connected to one set of terminals of a switch 38 which is also disposed in the compartment 32. A second set of conductors 40 extend from the other terminals of the switch 38 and pass through a knockout provided in one of the outer walls 18 defining the second compartment 32 so that they may be connected to a low voltage power supply (not shown).

A secondary coil 42 is disposed on either side of the primary coil 34 with each secondary coil comprising many thousands of turns of smaller diameter wire. A magnetizable core 43 passes through the primary and secondary coils 34,42 respectively. The secondary coils 42 are separated from the primary coil 34 by laminated magnetizable cores 44 which function as magnetic shunts. The windings of the coils 34,42 are isolated from contact with the magnetizable cores via insulation (not shown). A conductor 46 extends vertically from each secondary coil 42 and passes through a spacer 48. The conductors 46 terminate in an electrical connection with threaded rods 50 which sit on the spacers 48. A plastic cap 52 is associated with each threaded rod 50 and is threadably engaged therewith.

The portion of the side wall 20 forming a wall for the first compartment 30 is provided with knockouts 54 and 56 to permit conductors 58 extending from a transformer load to pass into the compartment 30. The caps 52 can be removed from the threaded rods 50 to permit conductors 58 to be wrapped around the threaded rods 50. The plastic caps 52 can then be threadably engaged with the rods 50 to secure the conductors 58 thereto. The first compartment 30 is also filled with an asphalt compound 60 to a level extending slightly above the spacers 48 so that a substantial portion of the threaded rods 50 and the caps 52 are exposed. The asphalt compound 60 provides support to the conductors 46, spacers 48 and the rods 50 to prevent them from pivoting about the connection to the transformer secondary coils 42 upon tightening of the caps 52 on the rods 50. This of course reduces the probability of the conductors 46 snapping and isolating the threaded rods 50 from the transformer secondary coils.

In operation, when it is desired to connect the transformer 10 to a low voltage power supply, typically from between 120 V to 377 V AC and to a transformer load, the top wall 14 of the housing 12 is removed to expose the caps 52 and threaded rods 50 projecting beyond the upper surface of the asphalt compound 60. The caps 52 are then removed from the threaded rods 50 and the conductors 58 extending from the transformer load are passed through the knockouts 54,56 provided in the side wall 20 so that they extend into the compartment 30. The conductors 58 are then wrapped around the threaded rods 50 and the caps 52 are threadably engaged with the rods 50 to secure the conductors thereto. The conductors 40 extending from the power supply pass through the knockout 41 provided in the second compartment 32 and are connected to the terminals of the switch 38. The top wall 14 of the transformer is then replaced to seal the connection between the rods 50 and the conductors 58 within the compartment 30 and to seal the connection between the conductors 40 and the terminals of the switch 38 within the compartment 32.

When the switch 38 is moved to the "on" position to connect the primary input conductors 36 to the conductors 40, the primary coil 34 is supplied with an AC supply voltage across its terminals. As is well known to those of skill in the art, in these types of transformers, when the primary coil 34 is energized, current flows through the primary windings thereby inducing a current flow in the secondary windings. Since the secondary coils include substantially more turns of windings than the primary coil 34, the input supply voltage supplied to the transformer primary is stepped up by the ratio of turns between the secondary and primary windings. Conventionally, the input voltage is stepped up to 9000 V, 12000 V or 15000 V depending on the transformer load. The stepped up voltage induced in the transformer secondary coils 42 is placed across the two threaded rods 50. The magnetic shunts provided by the magnetizable cores 44 act as a safety valve for the transformer 10 in that as the current in the secondary coils 42 increases, more of the magnetic lines of flux are bypassed by the core 44 resulting in fewer flux lines linking across the windings in the coil 42. This of course reduces the voltage induced across the secondary windings maintaining the required poor regulation characteristics of the neon transformer 10.

During use of the transformer 10, the windings in both the secondary and primary coils 34,42 dissipate energy in the form of heat due to $I^2R$ loss. Moreover, the magnetic core 43 and insulation also heat up thereby increasing the temperature of the transformer 10. Since both the secondary terminals 50 and the primary input conductors 36 are concealed within the housing 12, an additional transformer housing is not required as is typically needed in conventional transformers to isolate the secondary output terminals passing through the porcelain insulators from the environment. Thus, the provision of the single housing in the present transformer improves heat dissipation in the transformer. Moreover, since the secondary terminals 50 extend upwardly from the secondary coils 42 by a relatively small distance, and since the second compartment 32 need only be large enough to house the switch 38 or connectors connecting the low voltage power supply conductors 40 to the primary input conductors 36, the size of the housing is maintained in a compact configuration.

Thus, the present invention provides advantages in that the need for porcelain insulators on the secondary output terminals to isolate the secondary terminals from the transformer housing is removed by maintaining the secondary terminals within the housing and facilitating connection of the transformer load conductors to the secondary terminals. Furthermore, since a relatively small compact housing can be used to house the transformer components, heat dissipation in the transformer is also increased as compared with typical conventional neon transformers. Also, the provision of the switch 38 in the second compartment 32 allows the transformer primary coil 34 to be isolated from the low voltage power supply without manually disconnecting the conductors 40 from the primary input conductors 36.

It should be apparent to one skilled in the art that the present invention can be modified without departing from the scope thereof as defined by the appended claims.

We claim:

1. A neon or luminous tube transformer comprising:

a housing having a base, two pair of opposed side walls and removable top thereby to define an enclosure;

an intermediate wall within said enclosure and extending between a pair of said side walls and said base and top to divide said enclosure into first and second compartments;

a primary coil positioned between a pair of secondary coils, each of said coils being spaced apart and including a winding having a plurality of turns;

a first magnetizable core passing through each of said coils;

second magnetizable cores located between said secondary coils and said primary coil to define magnetic shunts, said coils and said magnetizable cores being located within said first compartment;

a pair of insulated primary input conductors connected to said primary coil and extending through said intermediate wall for connection to input power supply conductors within said second compartment;

a pair of electrically conductive secondary terminals extending from said secondary coils and terminating within said first compartment, said secondary terminals being spaced from the walls of said first compartment thereby to avoid the requirement for secondary terminal insulators;

releasable fastening means associated with each of said secondary terminals for releaseably securing an insulated output conductor extending to a transformer load thereto within said first compartment, at least one of the walls of said housing constituting a wall of said first compartment including means for allowing said output conductors to pass into said first compartment to permit engagement of said output conductors to said secondary terminals within said first compartment; and insulating means within said first compartment and covering said primary and secondary coils and said magnetizable cores.

2. A transformer as defined in claim 1 wherein said secondary terminals extend vertically from said secondary coils and are in the form of threaded rods, said releasable fastening means including a fastener associated with each threaded rod and being threadably engaged therewith for securing releasably an insulated output conductor to said rod within said first compartment.

3. A transformer as defined in claim 2 wherein said fasteners are in the form of plastic caps threadably engaged with said threaded rods and removable therefrom.

4. A transformer as defined in claim 1 wherein said second compartment is substantially smaller than said first compartment.

5. A transformer as defined in claim 1 further including switch means interconnecting the primary input conductors and the input power supply conductors within said second compartment, said switch means being operable to between first and second conditions to connect and disconnect the primary input conductors to and from and input power supply.

6. A transformer as defined in claim 1 wherein said insulating means in said first compartment is in the form of an asphalt compound, said asphalt compound being at a level within said first compartment to expose only a portion of said secondary terminals.

7. A transformer as defined in claim 5 wherein said secondary terminals extend vertically from said secondary coils and are in the form of threaded rods, said releasable fastening means including a fastener associated with each threaded rod and being threadedly engaged therewith for securing releasably an insulated output conductor to said rod within said first compartment.

8. A transformer as defined in claim 7 wherein said fasteners are in the form of plastic caps threadably engaged with said threaded rods and removable therefrom.

9. A transformer as defined in claim 8 wherein said insulating means in said first compartment is in the form of an asphalt compound, said asphalt compound being at a level within said compartment to expose only a portion of said secondary terminals.

* * * * *